United States Patent [19]

Bloch et al.

[11] Patent Number: 4,633,117
[45] Date of Patent: Dec. 30, 1986

[54] SLANTED AND CHIRPED SURFACE ACOUSTIC WAVE DEVICES

[75] Inventors: Paul D. Bloch; Michael E. Barnard; Edward G. S. Paige, all of Oxford, England

[73] Assignee: National Research Development Corp., London, England

[21] Appl. No.: 645,769

[22] Filed: Aug. 30, 1984

[30] Foreign Application Priority Data

Aug. 30, 1983 [GB] United Kingdom ................ 8323178

[51] Int. Cl.⁴ ............................................ H01L 41/08
[52] U.S. Cl. ............................ 310/313 B; 310/313 D
[58] Field of Search ........... 310/313 R, 313 A, 313 B, 310/313 C, 313 D; 333/150, 152, 154, 193, 195, 196

[56] References Cited

U.S. PATENT DOCUMENTS

| | | | |
|---|---|---|---|
| 3,919,669 | 11/1975 | Hartemann | 310/313 B X |
| 4,049,982 | 9/1977 | Cohen | 310/313 B |
| 4,063,198 | 12/1977 | Wagers et al. | 310/313 B X |
| 4,477,784 | 10/1984 | Maerfeld et al. | 310/313 D X |

Primary Examiner—Mark O. Budd
Attorney, Agent, or Firm—Cushman, Darby & Cushman

[57] ABSTRACT

A surface acoustic wave device comprises a transducer 1 consisting of two electrodes 2 and 3 deposited on the surface of a substrate 4. Transducer 1 is a slanted chirped transducer with short fingers 5 and 6 to focus any acoustic wave generated in the transducer to a position along a line 8 spaced from transducer dependent on the frequency of the signal.

20 Claims, 3 Drawing Figures

SLANTED AND CHIRPED SURFACE ACOUSTIC WAVE DEVICES

This invention relates to surface acoustic wave devices and equipment embodying such devices.

Surface acoustic wave (SAW) devices are devices in which an acoustic wave is propagated on the surface of a solid, usually a piezoelectric crystal, between transducers. Each transducer consists of a pair of electrodes. An electrode comprises a conduction bar and a plurality of fingers extending from the bar in a comb-like configuration. The pair of electrodes are deposited upon the surface of a piezoelectric crystal so that the fingers of the respective electrodes are positioned in interdigital relationship relative to each other. If an electric potential is applied between the electrodes a periodic potential is set up on the surface of the piezoelectric crystal underneath the transducer of period corresponding to the spacing between adjacent fingers. Similarly if an alternating potential is applied across the electrodes an alternating stress field is set up in the crystal which will tend to propagate away from the transducer along the crystal as a surface acoustic wave.

The frequency response of such a transducer depends upon the number of fingers and also upon the position of successive fingers, the optimum frequency of generation corresponding to an acoustic wavelength which is twice the spacing between the centres of adjacent fingers. A form of transducer is known in which the spacing between the centres of adjacent fingers is progressively increased in one direction. With such a transducer a short electrical input pulse will cause an acoustic wave train to be generated whose frequency (strictly, instantaneous frequency) varies along its length. From a fixed reception point the acoustic wave launched by such a transducer will have a frequency which progressively varies with time. A signal of this form is referred to as a chirped signal and likewise such a transducer is referred to as a chirped transducer. If the variation of finger position spacing is such as to produce a signal the frequency of which varies linearly with time it is referred to as a linear chirped transducer.

While in most forms of transducer the fingers are all at right angles to the conduction bars it is known to construct transducers in which the fingers are inclined at an angle other than 90° to the direction of the conduction bars. Such a transducer is known as an inclined or slanted transducer.

Known transducer designs use long finger lengths, typically 30 acoustic wavelengths or more, to minimise diffraction effects and simplify design procedures. Known slanted chirped transducers also have long finger lengths.

According to the invention a surface acoustic wave device comprises a conductive layer deposited on the surface of a substrate to form a slanted chirped transducer with short fingers, whereby a surface acoustic wave signal generated in the transducer is focused to a position on the surface of a substrate spaced from the transducer and dependent on the frequency of the signal.

Preferably the length of the fingers of the transducer is about 12 acoustic wavelengths or less.

Preferably also the transducer is a linear chirped or an exponentially chirped transducer.

The transducer may be rectilinear or may be curved. The curvature may follow a suitable law, for example a spiral curve the radius of which at any point is proportional to the exponential of the angle of the radius at that point from a reference radial line.

In order that the invention may be more fully understood reference will now be made to the accompanying drawings in which.

Figure 1:
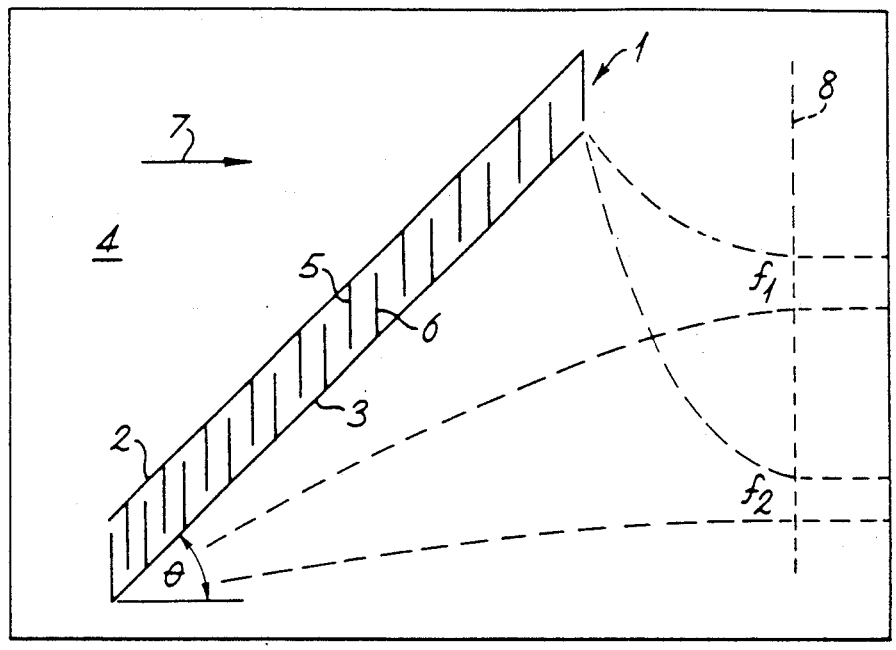
FIG. 1 illustrates an embodiment of the invention.

Referring now to FIG. 1 there is shown therein an slanted chirped transducer 1 consisting of two conduction bars 2 and 3 each provided with a series of fingers 5 and 6 respectively. Each conduction bar with its associated fingers forms an electrode. The transducer formed of the two electrodes is deposited on the surface of a substrate 4. Substrate 4 is a piezoelectric crystal, poled ceramic, or a material on which a film of piezoelectric material has been deposited.

The fingers 5 and 6 extend at an angle $\theta$ to a direction normal to the conduction bars 2 and 3. The spacing between adjacent fingers is not constant but progressively varies along the length of the conductors. The two sets of fingers are positioned so that they are in interdigital relationship relative to each other. The inclination of the fingers relative to the conductors enables angle $\theta$ to be defined as shown in FIG. 1 and a direction 7 extends at the angle $\theta$ to the electrodes.

For linear chirp the distance $x_n$ of the nth finger in the direction 7 from the commencement of the transducer is given by $$x_n = vf_oT/B[\{1 - B/f_o^2T(N/2-n)\}^{\frac{1}{2}} - 1]$$

where v is the velocity of the SAW, $f_o$ is the centre frequency, T is the time duration which for a transducer of length L is L cos $\theta$/v, B is the bandwidth, namely the difference between the extremes of chirp frequency, and N is the total number of fingers.

When an electrical signal is applied to the electrodes the fingers act as sources of surface waves and a radiation pattern is created dependent on the precise geometric arrangement of the transducer and the properties of the substrate. With a suitably chirped transducer the radiation pattern in direction 7 has the form depicted in FIG. 1. Surface waves are also radiated in the opposite direction but these diverge.

The lengths of the fingers 5 and 6 are short, being about 12 acoustic wavelengths or less, so that when an alternating electrical signal is applied to the electrodes 2 and 3 of frequency such that it lies within the bandwidth of the transducer (determined by the chirp), it will generate waves which propagate away from transducer 1 and will come to a focus somewhere along a line 8 spaced from transducer 1. In general line 8 will be neither normal to direction 7 nor will it be straight. The position of the focus along this line 8 will depend on the frequency of the signal applied to the transducer.

If a composite signal comprising two frequencies f1 and f2 is applied to the transducer then the two frequencies will be spatially separated to two focal regions as shown in FIG. 1. This is a useful feature of the arrangement shown in FIG. 1. It should be noted that in a suitably chirped transducer the majority of fingers of the transducer may contribute constructively to the output signal irrespective of its frequency. Finger length (strictly, finger overlap) is a factor which determines the contribution of fingers to the signal at a focus. As the finger length increases the main contribution comes from fewer fingers. The finger length can be chosen so that fingers contribute to an aperture weighting function across the whole of transducer 1.

A simplified expression of the focal length F on an isotropic substrate in terms of the frequency f of operation is given by $$F = (fT/B) v \tan^2 \theta$$

The beam width d at the focus is approximately $$d = (2v/B) \tan \theta$$

Substrate 4 may comprise a crystal having anisotropic properties which are advantageous. The lengths of the fingers are preferably chosen so that the radiation pattern from each finger contributes to a weighting function across the whole of the transducer 1. Lithium niobate is one such example, in which when waves propagate predominantly in the Z direction on a Y-cut surface they are focused to a narrow region and continue to travel along a narrow strip of crystal with only small divergence.

Figure 2:
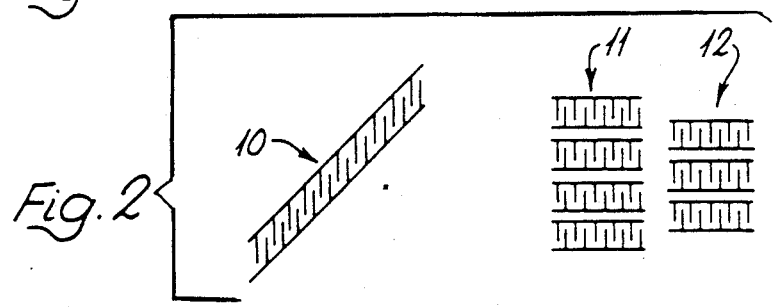
FIG. 2 and FIG. 3 illustrate applications of the invention to a frequency analyser and to a convolver respectively.

A spectrum analyser embodying the invention illustrated in FIG. 1 is shown in FIG. 2. An inclined chirped transducer 10 receives the input signal to be analysed and spaced apart to receive the different frequency components of this signal are a plurality of receiving transducers 11, 12 etc. These transducers are normal type transducers and have an optimum different single frequency depending on their position. It should be noted that on a material such as YZ lithium niobate since the various frequency components of the output can have a focal region which extended in direction 7 it is possible to stagger the positions of the output transducers in the manner shown and still allow each to receive its frequency signal despite the fact that the total width of all the receiving transducers is greater than the space occupied by all the individual frequency signals.

The extended focal region also allows output transducers to be used which are long in the direction of the extension. The transducers may conveniently be weighted to improve their frequency sidelobe rejection. One method of weighting the output transducers is to employ the known technique of withdrawal weighting. On materials that do not cause an extension of the focal region, long output transducers designed to act as waveguides can be used. Frequency sidelobe rejection may be improved by aperture weighting of transducer 1 by choice of finger length.

An alternative design of spectrum analyser embodying the invention has waveguides positioned to guide the focused SAW from the foci to output transducers sited elsewhere. This enables output transducers to be sited further apart.

Figure 3:
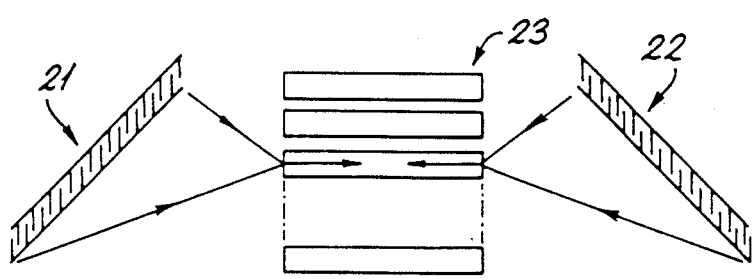

A further application of the transducer embodying the invention is shown in FIG. 3. In FIG. 3 a convolver structure is shown. Two inclined chirped transducers 21 and 22 are provided each of which receives an input signal. The outputs of the two transducers travel in opposite directions and output signals of similar frequency are arranged to coincide along a common line.

It is known that, due to non-linearity of substrate 4, an electrical output signal may be obtained between one of a plurality of electrodes 23 and an equivalently positioned electrode on the opposite face of substrate 4. This signal is the convolution of the two signals passing between the pair of electrodes. In the arrangement shown in FIG. 3 an output signal appears at each of the plurality of electrodes 23 and these signals are dependent on the arrival times and similarity of spectral components of the signals applied to transducers 21 and 22. In alternative arrangements a plurality of electrodes 23 can be provided which are interdigital with transducers 21 and 22 and are designed to focus radiation with a known frequency difference under each of these electrodes.

In the embodiments illustrated above each transducer element comprises single fingers. It is however possible to provide transducers which have split fingers if required.

What is claimed is:

1. A surface acoustic wave device comprising:
   a substrate having a surface;
   a conductive layer deposited on the surface of the substrate to form a slanted chirped transducer with fingers having lengths short enough that when an excitation signal is applied to the transducer, a surface acoustic wave signal is generated in the transducer and is focused to a position on the surface of the substrate spaced from the transducer, this position on the substrate being dependent on the frequency of the signal, and being in different locations on the surface for different frequencies.

2. The surface acoustic wave device as claimed in claim 1 in which the lengths of the fingers of the transducer are 12 acoustic wavelengths or less.

3. The surface acoustic wave device as claimed in claim 1 in which the transducer is a linear chirped transducer.

4. The surface acoustic wave device as claimed in claim 1 in which the transducer is an exponentially chirped transducer.

5. The surface acoustic wave device as claimed in claim 1 in which the transducer is rectilinear.

6. The surface acoustic wave device as claimed in claim 1 in which the transducer is curved.

7. The surface acoustic wave device as claimed in claim 6 in which the curvature is a spiral curve.

8. The surface acoustic wave device as claimed in claim 1 in which the said substrate has anisotropic properties.

9. The surface acoustic wave device as claimed in claim 8 in which the said substrate is crystalline.

10. A surface acoustic wave structure, comprising:
    a substrate having a surface;
    first and second conductive bars, disposed on said surface and spaced from one another;
    a plurality of fingers coupled to, and extending away from, each of said conductive bars, each said finger meeting one of said conductive bars at an angle, said fingers coupled to said first conductive bar being in an interdigital relation with said fingers coupled to said second conductive bar, and lengths of said fingers being short enough to cause a diffraction effect when an excitation signal is applied between said first and second conductive bars, the diffraction effect causing a surface acoustic wave produced by the structure to be focused at an area of the substrate, a location of such focused area on the substrate being dependent on a frequency of said excitation signal.

11. Structure as in claim 10 wherein said length of said fingers are substantially equal to or less than twelve wavelengths of said acoustic wave.

12. Structure as in claim 10 wherein said fingers are rectilinear.

13. Structure as in claim 10 wherein said angle is acute.

14. A surface acoustic wave device for producing a surface acoustic wave on a substrate, comprising:
   first and second conductive bars, deposited on the substrate spaced from and facing one another, each bar having a first surface, which surface faces the other bar;
   means for producing an excitation signal between said first and second conductive bars; and
   means for producing a focused surface acoustic wave on the substrate when said excitation signal is applied to said bars, said producing means comprising a plurality of finger means for producing a radiation pattern, each of said finger means having lengths which are short enough to cause interference between said radiation patterns produced by each other finger means in order to focus said surface acoustic wave to a focused area on said substrate, said focused area being a function of a frequency of said excitation signal, a plurality of finger means being coupled to each of said first surfaces of said first and second conductive bars respectively, so that finger means coupled to said first bar are in an interdigital relation with fingers coupled to said second bar.

15. A device as in claim 14 wherein said finger means meet said first and second bars, respectively at an angle, and wherein said finger means are of different lengths.

16. A device as in claim 14 wherein said finger means are of a length less than 12 acoustic wavelengths.

17. A device as in claim 14 wherein said conductive bars and said finger means form a rectilinear transducer.

18. A device as in claim 14 wherein said conductive bars and said finger means form a curved transducer.

19. A device as in claim 14 wherein said conductive bars and finger means form a slanted, chirped transducer.

20. A surface acoustic wave device comprising:
   a substrate having a surface;
   a conductive layer deposited on the surface of the substrate to form a slanted chirped transducer which is adapted to have an excitation signal applied thereto, with fingers having lengths short enough that a diffraction effect caused thereby focuses a generated surface acoustic wave onto the surface of the substrate spaced from the transducer at any of a plurality of surface positions dependent respectively on the frequency of the excitation signal.

* * * * *